United States Patent [19]

Ohkubo et al.

[11] Patent Number: 4,928,936
[45] Date of Patent: May 29, 1990

[54] LOADING APPARATUS

[75] Inventors: Yukiharu Ohkubo, Machida; Manabu Hosoya, Yokohama; Shinji Miura, Yokohama; Yuichi Aoki, Yokohama, all of Japan

[73] Assignee: Nikon Corporation, Tokyo, Japan

[21] Appl. No.: 406,813

[22] Filed: Sep. 12, 1989

Related U.S. Application Data

[63] Continuation of Ser. No. 128,307, Nov. 24, 1987, abandoned.

[30] Foreign Application Priority Data

Dec. 2, 1986 [JP] Japan ................................ 61-287309
Dec. 18, 1986 [JP] Japan ................................ 61-302421

[51] Int. Cl.$^5$ ............................................. B25B 1/22
[52] U.S. Cl. ........................................ 269/73; 269/21
[58] Field of Search ................ 29/559, 743; 100/214; 101/292, 293, 294, 295, 327, 328, 407.1; 269/21, 71, 73

[56] References Cited

U.S. PATENT DOCUMENTS 4,226,569 10/1980 Gerard et al. .................. 269/21 X

FOREIGN PATENT DOCUMENTS 155781 2/1984 Japan .
155782 5/1984 Japan .
166158 7/1986 Japan .

*Primary Examiner*—Steven Mottola
*Attorney, Agent, or Firm*—Shapiro and Shapiro

[57] ABSTRACT

An apparatus for loading a planar subject at a predetermined position has holding means operative to hold one one of the planar subject at a predetermined level, and regulating means for detecting the thickness of the planar subject from the amount of operation of the holding means and regulating the level of the other end of the planar subject. This loading apparatus is suitably used in a pattern depicting apparatus.

13 Claims, 13 Drawing Sheets

FIG. 18b

| DIRECTION CONTROL VALVE | | | | SUCKING AREA | | | | | | |
|---|---|---|---|---|---|---|---|---|---|---|
| 141A1 | 141A2 | 141A3 | 141A4 | R1 | R2 | R3 | R4 | R5 | R6 | R7 |
| 1 | 0 | 0 | 0 | 1 | 1 | 0 | 0 | 0 | 0 | 0 |
| 0 | 1 | 0 | 0 | 1 | 1 | 1 | 0 | 0 | 0 | 0 |
| 0 | 0 | 1 | 0 | 1 | 0 | 0 | 1 | 0 | 0 | 0 |
| 1 | 0 | 1 | 0 | 1 | 1 | 0 | 1 | 1 | 0 | 0 |
| 0 | 1 | 1 | 0 | 1 | 1 | 1 | 1 | 1 | 1 | 0 |
| 1 | 1 | 1 | 0 | 1 | 1 | 1 | 1 | 1 | 1 | 1 |
| 0 | 0 | 0 | 1 | 1 | 0 | 0 | 0 | 0 | 0 | 0 |

LOADING APPARATUS

This is a continuation application of Ser. No. 128,307 filed Nov. 24, 1987, now abandoned.

BACKGROUND OF THE INVENTION

1. Field of the Invention

This invention relates to a loading apparatus for loading a subject to be worked at a predetermined position, and in particular to a loading apparatus suitable for application in a pattern depicting apparatus for applying an energy beam to a subject to be worked and forming a pattern thereon. Further, the present invention relates to a moving stage device for use in an apparatus for optically depicting a pattern, for example, on a substrate to be printed or a reticle or the like which apparatus incorporates a loading apparatus therein.

2. Related Background Art

As a pattern depicting apparatus of this type, there has heretofore been proposed a pattern depicting apparatus in which a laser beam optically modulated on the basis of the figure-drawing data is caused to scan the surface of photoresist or dry film attached onto a substrate to be printed which is the subject of depiction, thereby depicting a precise pattern.

As shown, for example, in FIG. 1 of the accompanying drawings, a laser beam emitted from a laser light source 1 is input to a power monitor 3 through a half-mirror 2 and is thereby controlled to a predetermined quantity of light and also is supplied to a light modulator 5 via a mirror 4.

The laser beam is ON-OFF-modulated in the light modulator 5 in conformity with the figure-drawing data, whereafter it enters a rotatable polygon mirror 10 via mirrors 6 and 7 and lenses 8 and 9.

The rotatable polygon mirror 10 is rotated clockwise at a uniform speed, whereby the incident laser beam is reflected and deflected and passes through an fθ lens 11 and is condensed thereby, whereafter it is bent by a bending mirror 12 and is condensed on a subject of depiction, for example, the depicting surface 14 of a substrate 13 to be printed.

The laser beam scans the depicting surface of the substrate to be printed in x direction at a uniform speed each time the laser beam scans a reflecting surface of the rotatable polygon mirror 10 due to the deflection by the rotatable polygon mirror 10 and to the bending by the bending mirror 12, and at the same time, the timing of the scanning start is detected by a mirror 15 and a triggering detector 16 provided on the scanning start end side of the substrate 13 to be printed.

On the other hand, a moving stage (not shown) movable in y direction with the substrate 13 to be printed fixed thereon is moved in y direction each time the laser beam reflected by the bending mirror 12 scans once in x direction.

Thus, by the scanning of the laser beam in x direction and the movement of the moving stage in y direction being repeated, a pattern based on the figure-drawing data is depicted on the depicting surface 14 of the substrate 13 to be printed.

In order that a pattern of high accuracy may be depicted in such a pattern depicting apparatus, it is necessary that the laser beam condensed by the fθ lens 11 be properly imaged with a predetermined spot diameter on the depicting surface 14.

For this purpose, the substrate 13 to be printed must be held so that the depicting surface 14 may be accurately disposed at a predetermined level, and such purpose is achieved, for example, by a pattern depicting apparatus proposed in Japanese Utility Model application No. 155781/1984, 155782/1984 and Japanese patent application No. 166158/1986.

That is, as shown in FIG. 2 of the accompanying drawings, a reference member 23 is mounted on a moving stage slidden on a base board 20 in y direction perpendicular to the plane of the drawing sheet by rotation of a drive screw 21 mounted on the base board 20 and thereby moving the substrate 13 to be printed in y direction.

The reference member 23 has attached thereto actuators 25a and 25b for driving a sucking table 24 up and down, and a spring member 26 is loosely inserted over the drive shaft of each of the actuators 25a and 25b.

The sucking table 24 is formed with a plurality of sucking holes, and by sucking from a hose 27 provided on the underside of the sucking table 24, the substrate 13 to be printed placed on the sucking table 24 may be sucked and held.

Further, the reference member 23 has its upper end surface formed in an L-shaped crosssectional shape so as to cover the marginal portion of the substrate 13 to be printed from the upper surface side thereof, and the actuators 25a and 25b are adapted to be extended so as to urge the substrate 13 to be printed against the contacting surfaces 23a and 23b of L-shaped cross-section, thereby moving the sucking table 24 upwardly.

Thus, by setting the level of the contacting surfaces 23a and 23b to a predetermined level relative to the fθ lens 11, the substrate 13 to be printed can be held so that the depicting surface 14 is always at the level of the contacting surfaces 23a and 23b even if the thickness of the substrate 13 to be printed varies.

However, in such a pattern depicting apparatus, when as shown in FIG. 3 of the accompanying drawings, a pattern is to be depicted on a small substrate 13a to be printed which bears against only one, 23a, of two contacting surfaces 23a and 23b, there has been the problem that the depicting surface 14a cannot be held at a predetermined level.

That is, in the contacting surface 23a against which the depicting surface 14a of the substrate 13a to be printed bears, the depicting surface 14a of the substrate 13a to be printed is held at the level of the contacting surface 23a, whereas in the contacting surface 23b, the depicting surface 14a does not bear against it and therefore, the sucking table 24 is pushed up above a predetermined level by the actuators 25a and 25b.

As a result, the substrate 13a to be printed is held inclined with respect to a predetermined reference plane and accordingly, the diameter of the spot imaged on the depicting surface 14a differs between the contacting surface 23a side and the contacting surface 23b side, and correspondingly this has led to the problem that a pattern cannot be depicted with good accuracy on the depicting surface 14a.

Also, such a pattern depicting apparatus is used in a moving stage device which has an x stage movable in the X-axis direction in X - Y horizontal plane, a Y stage installed thereon and movable in the Y-axis direction and a Z stage installed thereon and movable in the Z-axis direction orthogonal to the X - Y horizontal plane and in which a sample table is installed on the Z stage, and such moving stage device suffers from the problem that it is high in the Z-axis direction because three stages are piled.

SUMMARY OF THE INVENTION

It is an object of the present invention to provide a loading apparatus which can dispose a planar substrate at a desired level.

It is a further object of the present invention to propose a pattern depicting apparatus which can depict a pattern with good accuracy even on a small substrate to be printed.

It is still a further object of the present invention to provide a moving stage device suitable for incorporating such a loading apparatus therein.

It is yet still a further object of the present invention to provide a moving stage device which has an X stage movable in the X-axis direction in X - Y horizontal plane, a Y stage installed thereon and movable in the Y-axis direction and a Z stage installed thereon and movable in the Z-axis direction orthogonal to the X - Y horizontal plane and in which a sample table is installed on the Z stage and wherein the height in the Z-axis direction is minimized.

In the apparatus of the present invention, there are provided holding means operative to hold one end of a planar subject at a predetermined level and regulating means for detecting the thickness of the planar subject from the amount of operation of said holding means and regulating the level of the other end of the planar subject on the basis of the result of the detection, whereby the planar subject can be held at a predetermined level and also, by the level of the other end being regulated in conformity with the thickness of the planar subject, the entire planar subject can be held at a predetermined level.

BRIEF DESCRIPTION OF THE DRAWINGS

The invention will be described in greater detail with respect to its preferred embodiments with reference to the accompanying drawings, in which:

FIGS. 8 to 18b show an example of a moving stage device which can incorporate the above embodiments therein;

FIG. 8 is a perspective view of the essential portions of the moving stage device;

FIG. 9 shows the general construction of a depicting apparatus;

FIG. 10 is a fragmentary enlarged cross-sectional view of the FIG. 8 device;

FIG. 11 is a circuit diagram of an air pressure circuit;

FIG. 12 is a circuit diagram of a feedback control circuit;

FIG. 13 illustrates a four-division detector;

FIG. 14 shows the operation sequence;

FIG. 16 is a plan view of a substrate to be printed for illustrating a modification;

FIG. 17 illustrates the sucking area;

FIG. 18b shows the relation between the input and output of the circuit of FIG. 18a.

DESCRIPTION OF THE PREFERRED EMBODIMENTS

An embodiment of the present invention applied to a pattern depicting apparatus will hereinafter be described with reference to FIGS. 4 to 6.

Figure 1:
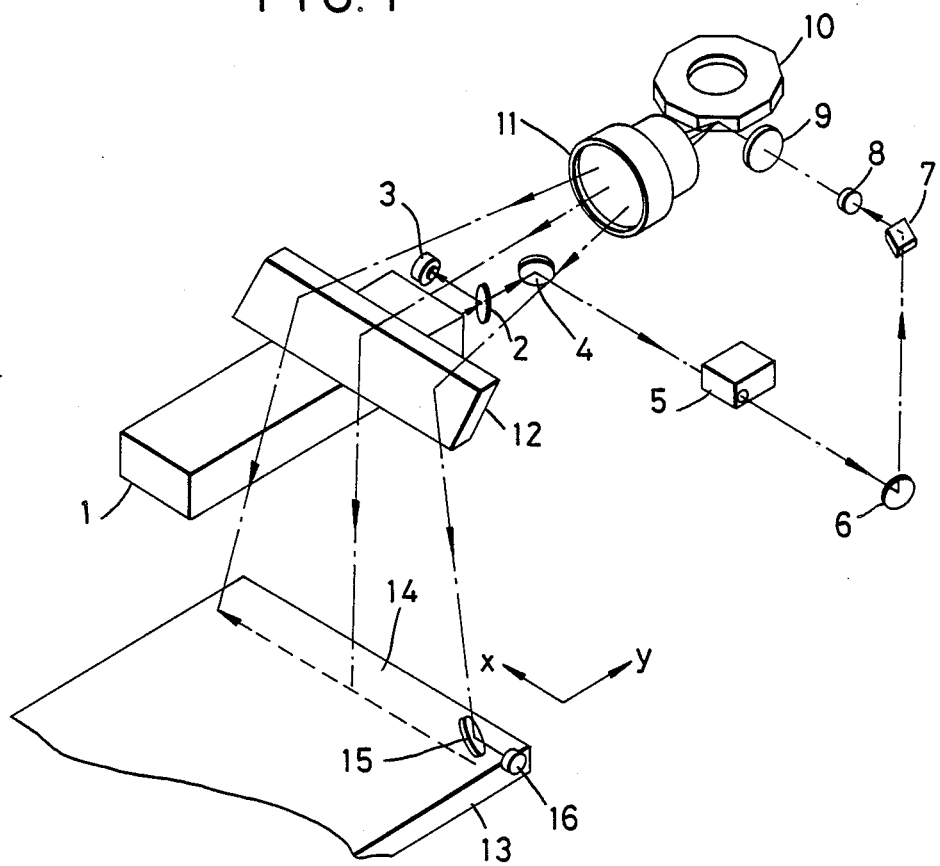
FIG. 1 is a perspective view showing a pattern depicting apparatus according to the prior art.
Figure 2:
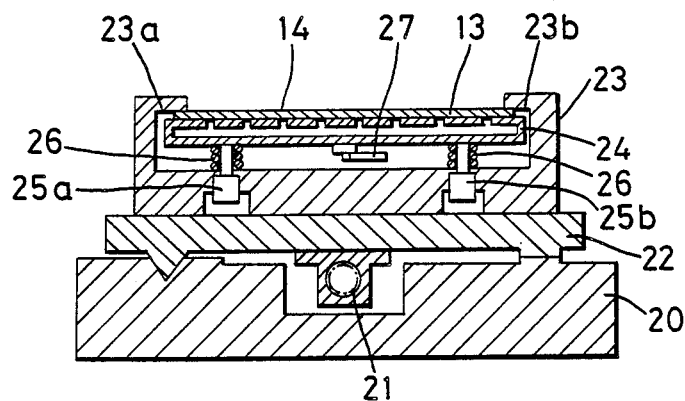
FIGS. 2 and 3 are cross-sectional views of the FIG. 1 apparatus.
Figure 3:
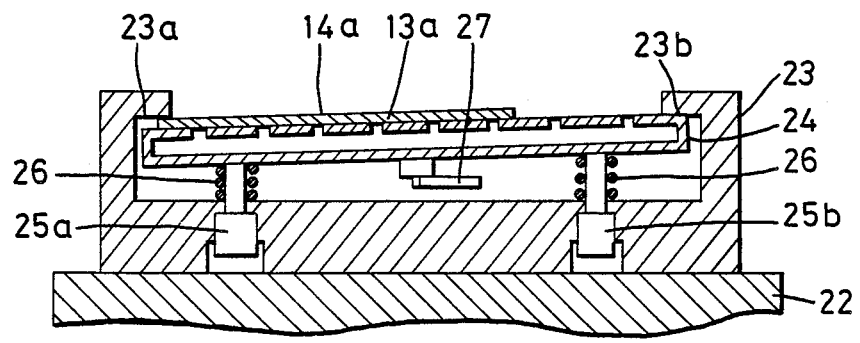
Figure 4:
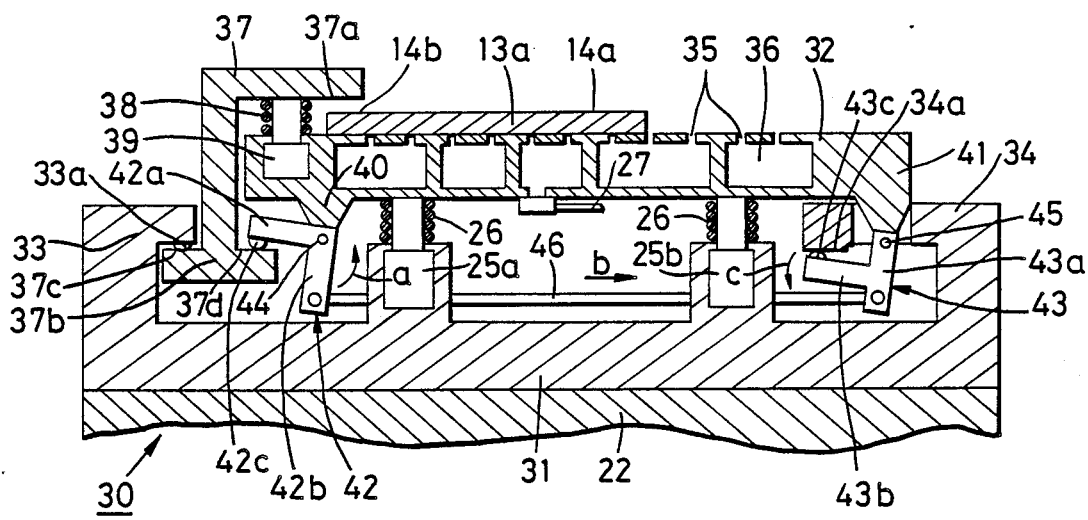
FIGS. 4, 5 and 6 are cross-sectional views showing a first embodiment of a pattern depicting apparatus according to the present invention.

In FIG. 4 wherein portions corresponding to those in FIG. 1 are given identical reference numerals, the reference numeral 30 generally designates a pattern depicting apparatus, which is shown in a state in which a substrate 13a to be printed is placed thereon.

A reference member 31 fixed on a moving stage 22 is provided with actuators 25a and 25b for vertically driving a sucking table 32, and has on the upper surface portion thereof protrusions 33 and 34 extending from the marginal portion toward the center.

The sucking table 32 has a plurality of sucking holes 35 in the upper surface portion thereof, supports thereon a substrate 13a to be printed which is a planar subject, and is adapted to suck and hold the substrate 13a to be printed smaller than the sucking table 32 by changing over a chamber 36 in the sucking table 32 and sucking by means of a hose 27.

Further, the sucking table 32 has attached thereto a clamp member 37 having a contacting surface 37a in the fore end portion thereof, through an actuator 39 having a spring 38 loosely inserted in a drive shaft. The clamp member 37 is adapted to hold one marginal portion of the substrate 13a to be printed which is outside the depicting area between it and the upper end surface of the sucking table 32, as shown in FIG. 5, by the actuator 39 contracting.

The clamp member 37 has on the root portion 37b thereof a contacting surface 37c opposed to the lower surface of the protrusion 33 of the reference member 31, and when the actuator 39 is extended, the contacting surface 37c makes point-contact with a semi-spherical contacting portion 33a provided on the protrusion 33, whereby the contacting surface 37a of the clamp member 37 may be held at a predetermined level from the movable stage 22.

Figure 6:
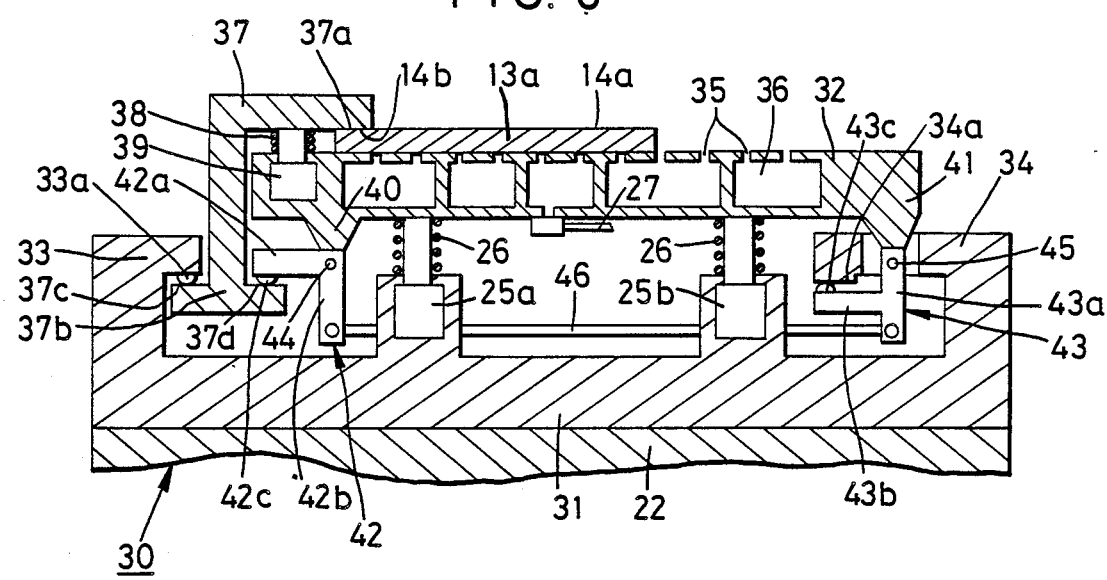

Accordingly, by the actuators 25a and 25b being extended with the substrate 13a to be printed remaining held as shown in FIG. 6, the clamp member 37 is moved upwardly with the sucking table 32 and as a result, the clamp member 37, with the protrusion 33 of the reference member 31, holds the contacting portion 14b of a depicting surface 14a bearing against the contacting surface 37a always at a predetermined level relative to the reference member 31 independently of the thickness of the substrate 13a to be printed. That is, the clamp member 37, with the sucking table 32 and the protrusion 33, constitutes holding means operative to hold the depicting surface 14a of the substrate 13a to be printed at a predetermined level.

Further, the sucking table 32 has projections 40 and 41 on the outer lower surfaces of the actuators 25a and 25b, and cranks 42 and 43 are pivotably mounted on the fore end portions of the projections 40 and 41 by means of pivot shafts 44 and 45.

One crank 42 is of an L-shape provided with an arm 42a extending about the pivot shaft 44 in the direction of the outer edge of the reference member 31 and an arm 42b extending downwardly in a direction substantially perpendicular thereto, and a rod 46 is pivotably mounted on the end portion of the arm 42b. Further, the crank 42 has a semi-spherical contacting portion 42c on the lower end surface of the arm 42a, and when the crank 42 is pivoted, the contacting portion 42c is adapted to make point-contact with and bear against a contacting surface 37d provided upwardly on the clamp member 37 at a location opposed to the arm 42a.

In contrast, the other crank 43 is of a T-shape provided with a downwardly extending arm 43a and an arm 43b extending substantially perpendicularly thereto from an intermediate portion of the arm 43a toward the center of the reference member 31, and a semi-spherical contacting portion 43c is provided on the upper surface of the end of the arm 43b.

When the crank 43 is pivoted, the contacting surface 43c is adapted to make point-contact with and bear against a contacting surface 34a provided downwardly on the protrusion 34 of the reference member 31 at a location opposed to the arm 43b.

Further, the arm 43a has a rod 46 pivotably mounted on the end portion thereof and as a result, pivotal movement of the crank 43 is adapted to be associated with the crank 42 through the rod 46.

The contacting surface 34a of the protrusion 34 is set at the same level as the level of the end portion of the contacting portion 33a of the protrusion 33, and likewise, the contacting surface 37c is set at the same level as the contacting surface 37d.

Accordingly, when the actuators 25a and 25b are extended with the substrate 13a to be printed being supported, the pivotal movement of the crank 42 in the direction of arrow a (FIG. 4) is limited by the contacting portion 42c bearing against the contacting surface 37d, and the greater is the thickness of the substrate 13a to be printed, the smaller is the amount of pivotal movement.

Correspondingly, the amount of displacement of the rod 46, connected to the crank 43, in the direction of arrow b becomes smaller and along therewith, the range of pivotal movement of the crank 43 in the direction of arrow c about the contacting portion 43c also becomes smaller.

As a result, the level of the sucking table 32 on the crank 43 side is held at a low level correspondingly to the limited amount of pivotal movement of the crank 43.

That is, the clamp member 37, the sucking table 32, the protrusions 33 and 34, the cranks 42 and 43 and the rod 46 together constitute regulating means for detecting the thickness of the substrate 13a to be printed by the rod 46 being displaced in conformity with the thickness of the substrate 13a to be printed with the contacting surface 37a of the clamp member 37 as the reference, and regulating the level of the depicting surface 14a of the other end of the substrate 13a to be printed on the basis of the result of the detection.

Thus, if the shapes of the cranks 42 and 43 (i.e., the mounted positions of the contacting portions 42c and 43c relative to the pivot shafts 44 and 45 and the mounted position of the rod 46) and the mounted positions of the pivot shafts 44 and 45 are chosen to predetermined positions, the level of the depicting surface of the other end on the crank 43 side can be set to the same level relative to the contacting surface 14b of the depicting surface 14.

As a result, even if the thickness of the substrate 13a to be printed varies, the sucking table 32 can always be held horizontally and thus, the left end portion of the depicting surface 14a is held at a predetermined reference position by the contacting surface 37a and therefore, as the whole of the substrate 13a to be printed, the depicting surface 14a can be held at a predetermined level.

In the above-described construction, when the substrate 13a to be printed is to be placed on the apparatus, the actuators 25a and 25b are contracted while, at the same time, the actuator 39 is extended, as shown in FIG. 4.

Figure 5:
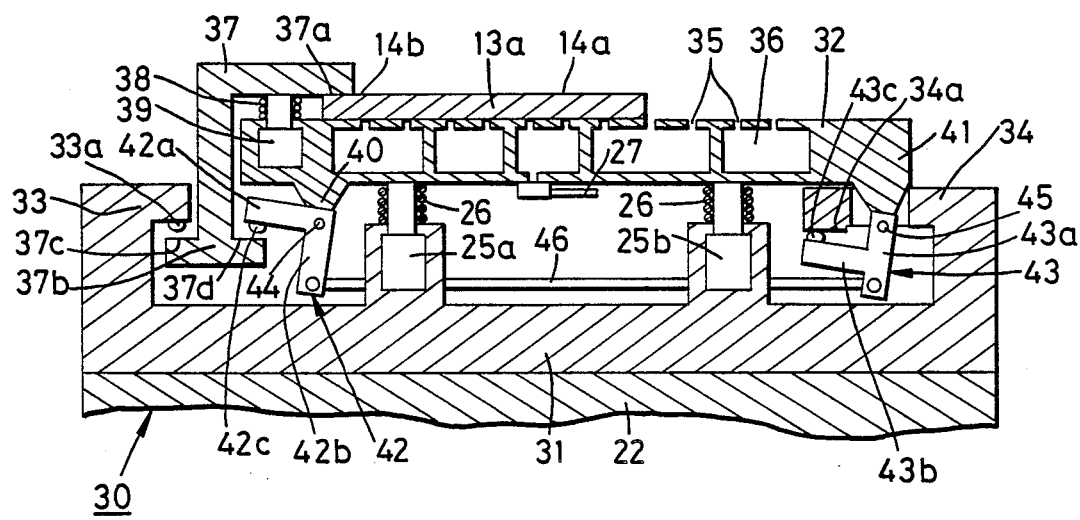

Subsequently, as shown in FIG. 5, the actuator 39 is contracted and the substrate 13a to be printed is held, whereafter the actuators 25a and 25b are extended as shown in FIG. 6. At that time, the contacting surface 37c of the clamp member 37 bears against the contacting portion 33a, whereby the left end portion of the depicting surface 14a is held at a predetermined level and the contacting portions 42c and 43c of the cranks 42 and 43 bear against the contacting surfaces 37d and 34a, whereby the depicting surface 14a is held horizontally relative to the left end portion.

According to the above-described construction, even when a pattern is to be depicted on the substrate 13a to be printed smaller than the sucking table 32, the depicting surface 14a of the substrate 13a to be printed can be held at a predetermined level independently of the thickness of the substrate 13a to be printed.

Accordingly, with regard to the entire depicting surface, a laser beam can be condensed with a predetermined spot diameter and therefore, patterns of high accuracy can be depicted.

Figure 7:
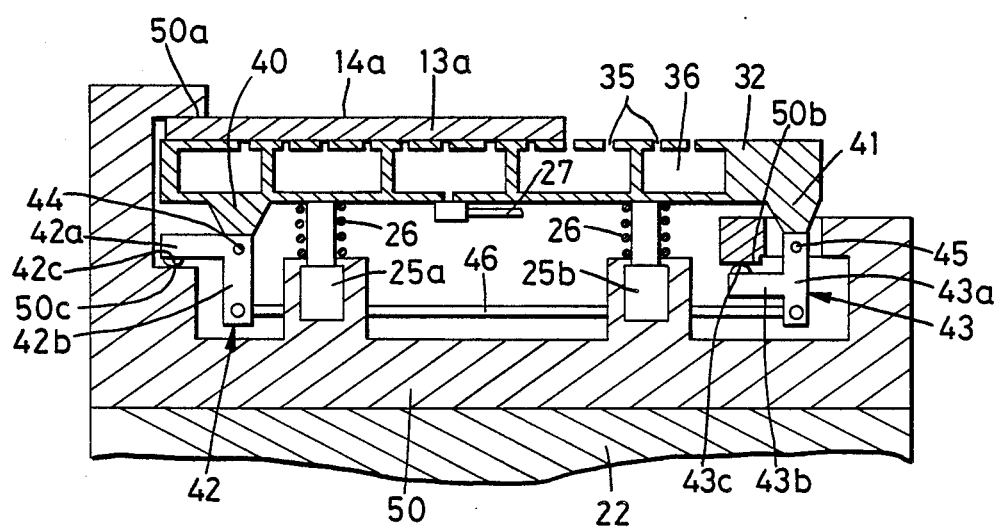
FIG. 7 is a cross-sectional view showing a second embodiment of the present invention.

FIG. 7 shows a second embodiment of the pattern depicting apparatus according to the present invention. This embodiment is such that the clamp member 37 and reference member 31 in FIG. 1 are made integral with each other.

That is, the left end portion of a reference member 50 is cocked up to assume an L-shape so that the fore end portion thereof covers the substrate 13a to be printed, and a contacting surface 50a is provided so that the level of the depicting surface of one end of the substrate 13a to be printed is a predetermined level.

Further, the reference member 50 has a contacting surface 50c at the same level as a contacting surface 50b, which bears against the contacting portion 43c of the crank 43, and the contacting portion 42c of the crank 42 is adapted to make point-contact with the contacting surface 50c.

In the construction of FIG. 7, after the actuators 25a and 25b are contracted, the substrate 13a to be printed is placed on the apparatus and the actuators 25a and 25b are extended, whereby the left end portion of the depicting surface 14a is held at the level of the contacting surface 50a. Further, at that time, the contacting portions 42c and 43c of the cranks 42 and 43 bear against the contacting surfaces 50c and 50b, whereby the depicting surface 14a is held horizontally relative to the left end portion.

According to the construction of FIG. 7, it is not necessary to provide a clamp member specially and therefore, an effect equal to that in the case of FIG. 4 can be provided by a construction simpler than the construction of FIG. 4.

The above embodiments have been described with respect to a case where the present invention is applied to a pattern depicting apparatus using the laser beam raster scanning system, whereas this is not restrictive, but for example, an electron beam may be used as the depicting beam, and the scanning system is not restricted to the raster scanning system, but the present invention is widely applicable to pattern depicting apparatuses of various scanning types.

Also, the above embodiments have been described with respect to a case where a substrate to be printed is used as the subject to be depicted, whereas the present invention is not restricted thereto, but is widely applicable to pattern depicting apparatuses for depicting patterns on various subjects to be depicted.

As described above, according to the abovedescribed embodiment, even a small subject to be depicted can be held so that the position of the depicting surface is at a predetermined level independently of the thickness of the subject to be depicted and therefore, patterns of high accuracy can be depicted.

Figure 8:
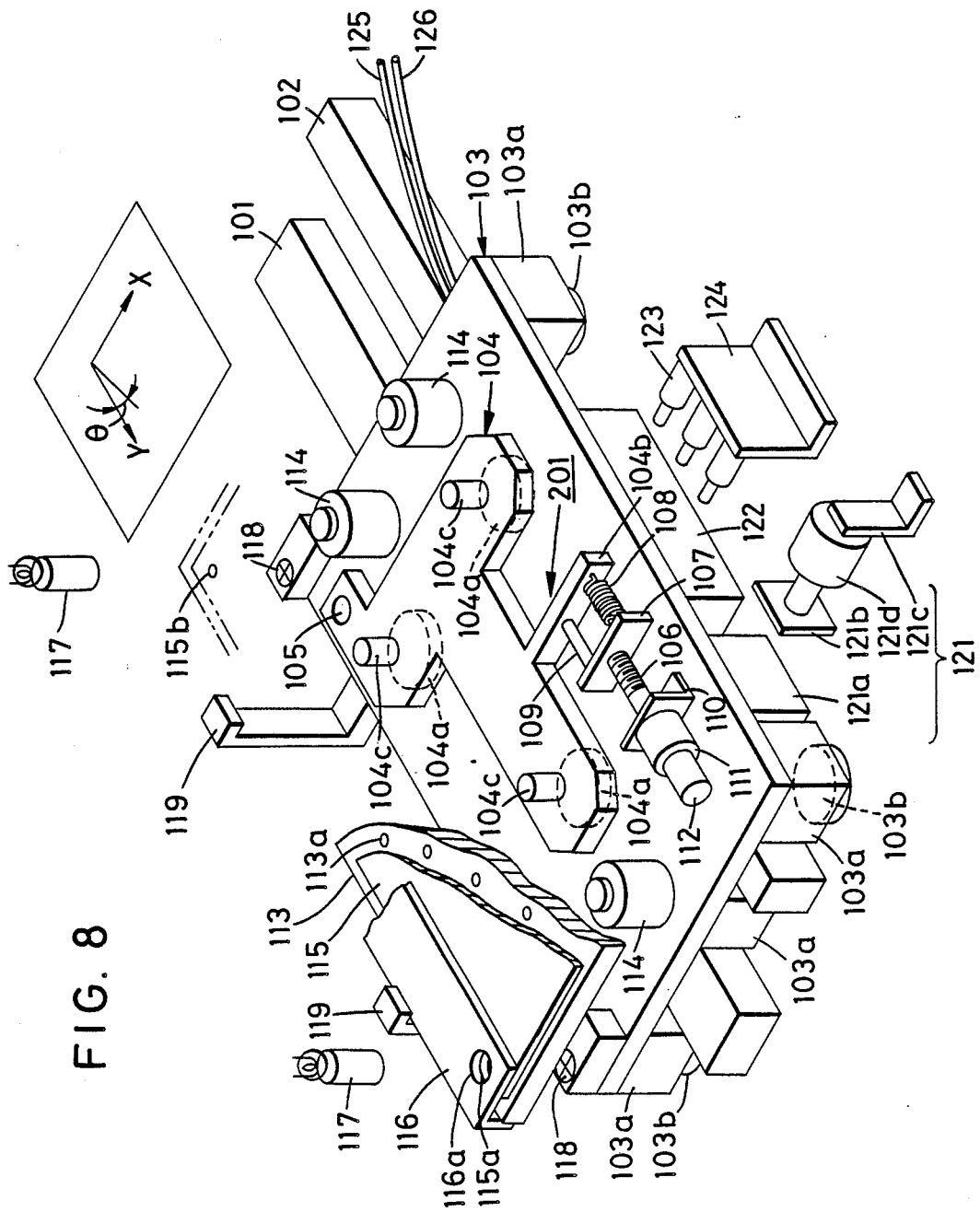

Reference is now had to FIG. 8 and so forth to describe an example of the moving stage device suitable for a depicting apparatus using the planar subject loading apparatus as described above.

Figure 9:
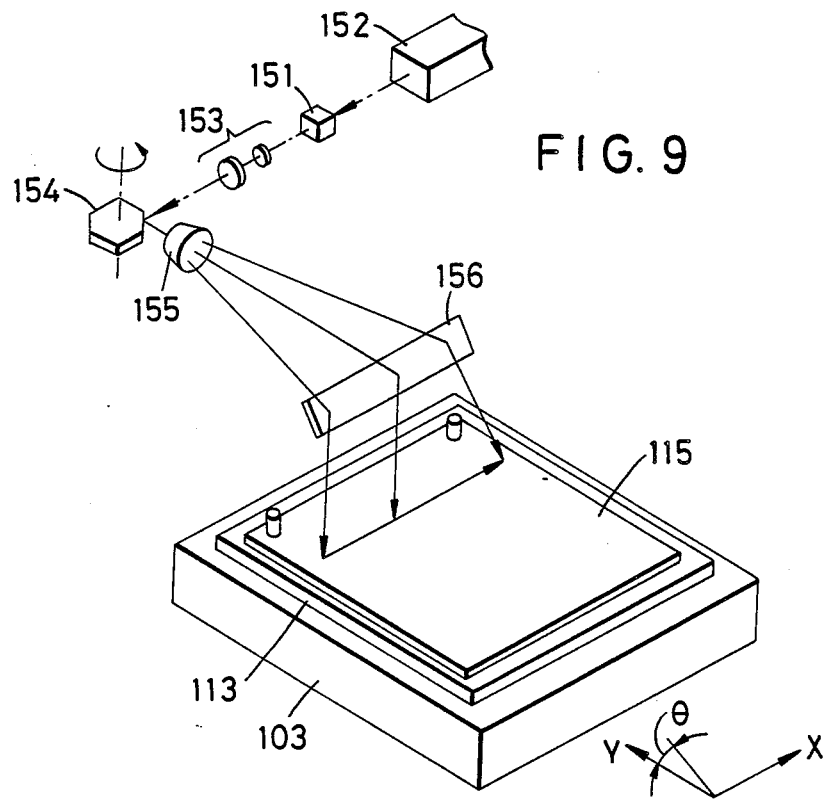

FIG. 9 shows a depicting apparatus using such moving stage device.

Referring to FIG. 9, a substrate 115 to be printed is placed on the upper surface of a sample table 113 provided on a moving stage 103 movable one-dimensionally in Y direction. A laser beam from a laser light source 152 light-modulated by a light modulator 151 is applied as a light spot to the substrate 115 to be printed through a beam expander 153, a rotatable polygon mirror 154, an fθ lens 159 and a bending mirror 156, and by the raster scanning of the light spot and the movement of the moving stage 103 in Y direction, a desired pattern may be depicted on the substrate 115 to be printed.

FIG. 8 is a perspective view of the moving stage device of such a depicting apparatus. A guide 101 extending in the direction of the Y-axis is provided on a stage mount, not shown, and a linear motor 102 is provided at a predetermined interval from the guide 101. A pneumatic bearing constituted by a block 103a and an air pad 103b is provided on the lower surface of the moving stage 103, and the moving stage 103 may be guided by the guide 101 and slidably moved in the direction of the Y-axis on the stage mount by the linear motor 102.

Figure 10:
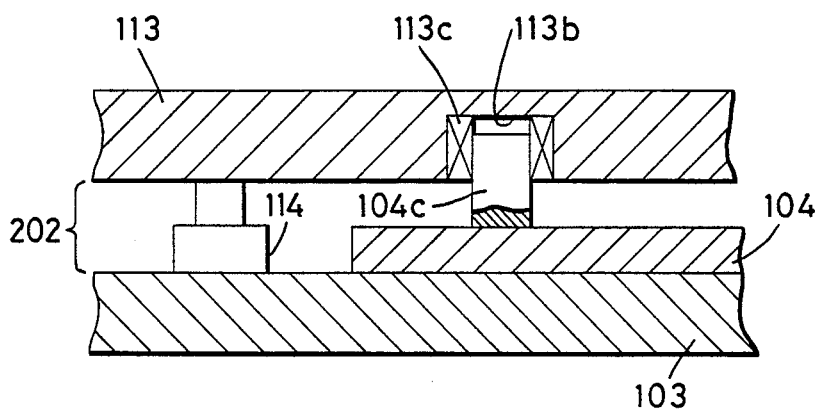

A θ stage 104 provided with three air pads 104a on the lower surface thereof is installed on the upper surface of the moving stage 103. This θ stage is rotatable in θ direction about a guide pin 105 and may be guided by the guide pin 105 to float up from the moving stage 103 by the air pads 104a. A tension spring 108 is stretched between the arm 104b of the θ stage 104 and a push plate 107 movable in the direction of the Y-axis by a feed screw 106, and the arm 104b bears against a stopper 109 projectedly provided on the push plate 107 with the aid of the spring force of the tension spring 108. The feed screw 106 is connected to the shaft of a motor 111 mounted on a support member 110 provided on the moving stage 103. A rotary encoder 112 is provided to know the revolutionary state of the motor 111. Accordingly, by the revolution of the motor 111, the push plate 107 and the stopper 109 are moved in the direction of the Y-axis to push the arm 104b, whereby the θ stage 104 is rotated about the guide pin 105. Three guide pins 104c are studded in the upper surface of the θ stage 104, and as shown in FIG. 10, those pins 104c are vertically slidably inserted in a guide hole 113b formed in the lower surface of the sample table 113, through a bearing 113c. Thus, when the θ stage 104 is rotated in θ direction, the sample table 113 is also rotated in θ direction. These members together constitute a rotatable stage mechanism 201.

Also, three air pressure cylinders 114 are installed on the upper surface of the moving stage 103, and by pushing up the lower surface of the sample table 113, the sample table 113 is guided for vertical movement by the guide pins 104c. A reference level setting member 119 is provided on the moving stage 103 to set the level of the substrate 115 to be printed on the sample table 113 constantly irrespective of the thickness thereof.

A plurality of vent holes 113a are formed in the upper surface of the sample table 113, and the substrate 115 to be printed is vacuum-sucked to and held on the sample table 113 through the vent holes 113a. The sample table 113 is provided with a clamp member 116 connected thereto by a guide, not shown, and an air pressure cylinder 116b (FIG. 11) and vertically movable relative to the sample table 113, and the substrate 115 to be printed is held between the clamp member 116 and the sample table 113.

Alignment reference holes 115a and 115b are formed at two corners of the substrate 115 to be printed used in the present embodiment, and as will be described later, alignment of the substrate 115 to be printed is accomplished with the aid of these reference holes 115a and 115b. For this purpose, a light-passing hole 116a opposed to the reference holes 115a and 115b is formed in the clamp member 116, and an illuminating optical system 117 is provided above it. On the other hand, in the sample table 113, a light-passing hole, not shown, is formed in opposed relationship with the light-passing hole 116a, and a position sensor 118 is provided just beneath it. The positions of the alignment reference holes 115a and 115b illuminated by the illuminating light are detected by the position sensor 118 through the respective holes.

The reference numeral 121 designates an automatic detachable connector, and the signals of the position sensor 118, the motor 111 and the rotary encoder 112 are connected to the control circuit of the depicting apparatus body through this connector 121. That is, the automatic detachable connector 121 has a contact member 121a secured to the moving stage 103 and having a plurality of contacts, and a probe member 121b provided with a plurality of probes corresponding to said contacts, and gives and takes signals by the probes bearing against the contacts when the moving stage 103 is in its initial position as shown in FIG. 8. The probe member 121b is attached to an air pressure cylinder 121d supported by the bracket 121c of the depicting apparatus body, and may be brought into contact with and spaced apart from the contact member 121a by the expansion and contraction of the cylinder 121d.

The reference numeral 122 designates an air pressure logic circuit portion carried on the moving stage 103, and the operating portions of a plurality of mechanically operated type direction control valves (designated by 122 in FIG. 11) protrude sideways of the moving stage. A plurality of air pressure cylinders 123 (only three of which are shown in FIG. 8) are supported in opposed relationship with said operating portions by a bracket 124, and the direction control valves are changed over by the expansion and contraction of the air pressure cylinder 123. Due to this logic circuit portion 122, the tubes of the air pressure control system may be two tubes, namely, a tube 125 connected to an air pressure source and a tube 126 connected to a vacuum source.

Figure 11:
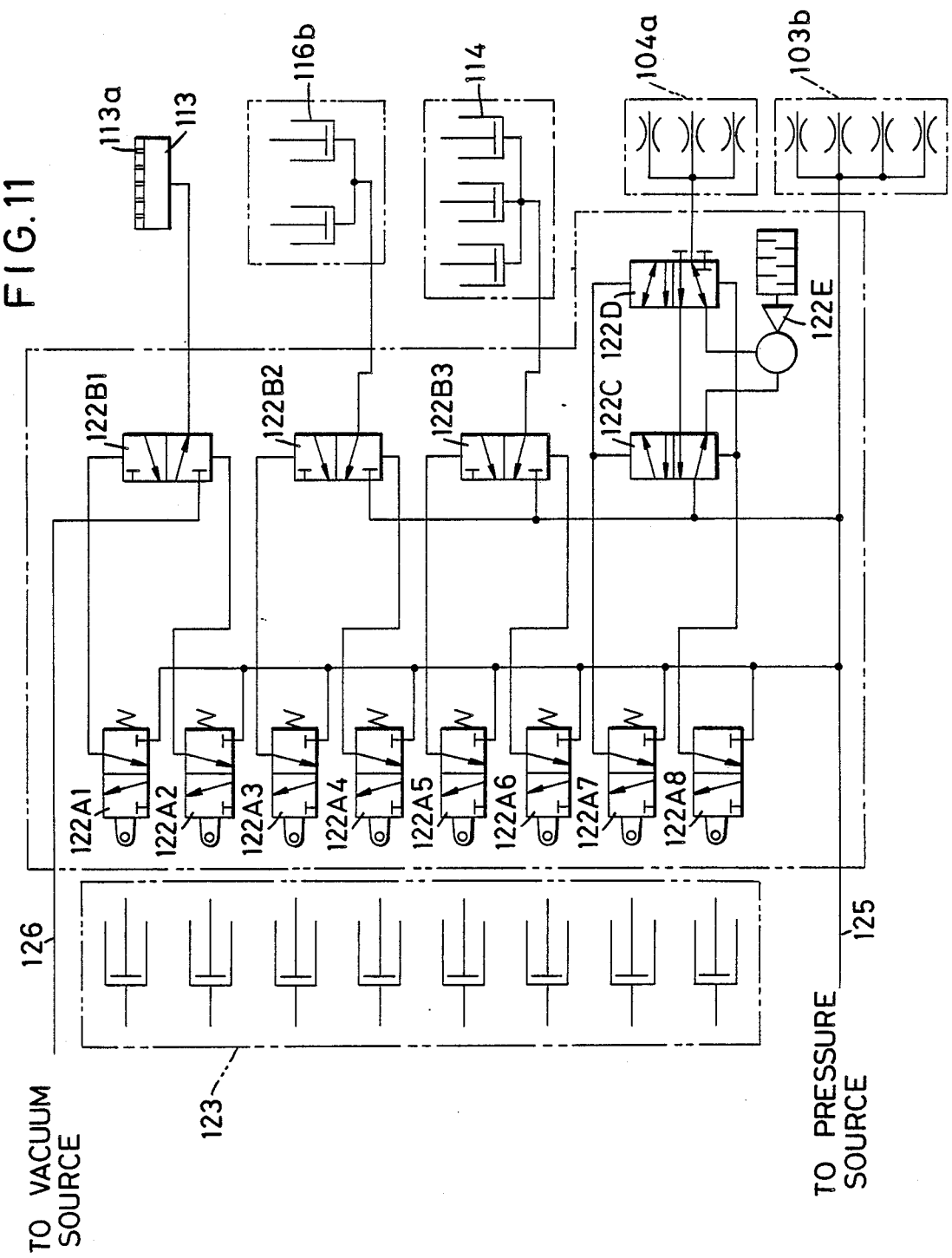

FIG. 11 is a circuit diagram of an air pressure circuit, and the aforementioned air pressure logic circuit 122 effects the following four operation controls:

(a) It effects the vacuum sucking of the substrate 115 to be printed;
(b) It effects the clamping of the substrate 15 to be printed;
(c) It moves the sample table 113 up and down; and
(d) It injects compressed air from the air pads 104a of the θ stage 104 and also effects the vacuum sucking.

The above-mentioned operations are performed by suitably changing over the mechanically operated type direction control valves 122A1–122A8 by the air pressure cylinders 123 secured to the depicting apparatus body. The direction control valves 122A1 and 122A2 are for vacuum-sucking the substrate 115 to be printed, and change over a change-over valve 122B1 disposed in a path which communicates the vacuum source with the vent holes 113a of the sample table 113. The direction control valves 122A3 and 122A4 are for moving the clamp member 116 up and down, and changes over a change-over valve 122B2 disposed in a path which communicates the air source with the air pressure cylinder 116b for moving the clamp member up and down. The direction control valves 122A5 and 122A6 are for moving the sample table 113 up and down, and changes over a change-over valve 122B3 disposed in a path which communicates the air source with the air pressure cylinder 114 for moving the sample table up and down. The direction control valves 122A7 and 122A8 are for floating and sucking the θ stage 104, and changes over change-over valves 122C and 122D. When the direction control valve 122A7 is operated, the compressed air from the air source is injected from the air pads 104a via the change-over valves 122C and 122D, and the θ stage 104 floats up from the moving stage 103 and becomes rotatable in θ direction. Conversely, by the operation of the direction control valve 122A8, the change-over valves 122C and 122D are changed over to their shown states, and the compressed air passed through the change-over valve 122C is supplied to a conventional vacuum generating device 122E, which thus generates a vacuum state This vacuum state is directed to the air pads 104a via the change-over valve 122D, and the θ stage 104 is fixed relative to the moving stage 103. The air pad 103b of the moving stage 103 is connected to the air pressure source.

Figure 12:
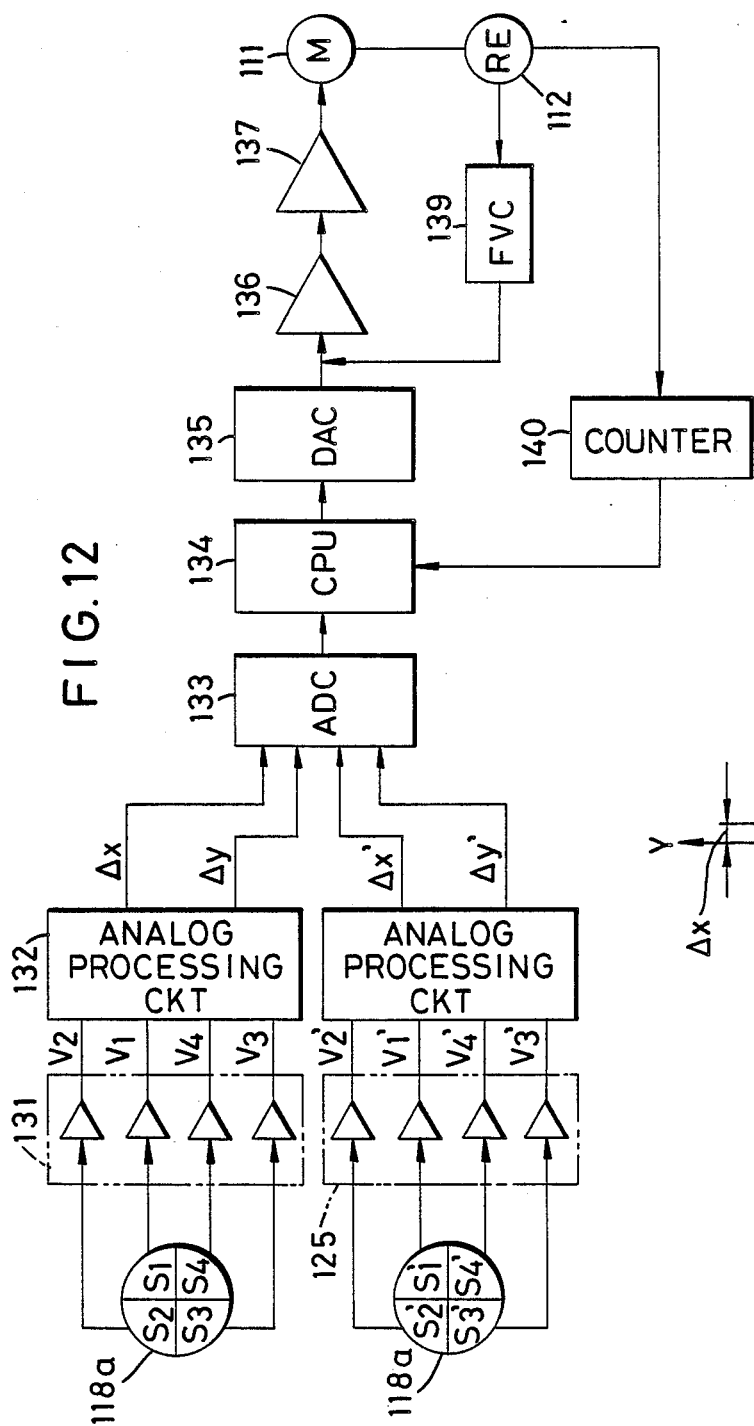

FIG. 12 shows a feedback control circuit for driving the θ stage.

Figure 13:
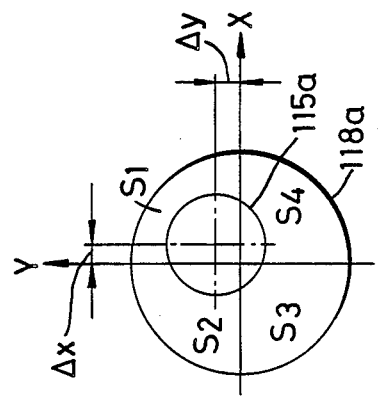

In this embodiment, if the substrate 115 to be printed is displaced relative to the reference position, the displacement is detected by a position sensor 118 and the θ stage 104 is rotated, whereby the displacement is corrected. The position sensor 118 used in the present embodiment is a socalled four-division detector 118a having four lightreceiving elements $S_1$–$S_4$, as shown in FIG. 13. As shown in FIG. 13, when the position of an alignment reference hole 115a is displaced by Δx in the X-axis direction and Δy in the Y-axis direction relative to the center of the four-division detector 118a, there are established the following relations between voltage values $V_1$, $V_2$, $V_3$, $V_4$ obtained by voltage-converting the signals provided by the lightreceiving elements $S_1$, $S_2$, $S_3$, $S_4$ of the four-division detector 118a by a preamplifier 131 and the positional displacements Δx, Δy of the alignment reference hole 115a:

$$\Delta x = k \times \frac{(V_1 + V_4) - (V_2 + V_3)}{V_1 + V_2 + V_3 + V_4}$$

$$\Delta y = k \times \frac{(V_1 + V_2) - (V_3 + V_4)}{V_1 + V_2 + V_3 + V_4}$$

where k is a proportion constant. This calculation is effected by an analog processing circuit 132, and the result thereof is converted to a digital signal by an analog-digital converter 133 and is supplied as the position data of the alignment reference hole 115a to CPU 134.

Likewise, the positional displacements Δx' and Δy' of an alignment reference hole 115b are also calculated and input to the CPU 134. In the CPU 134, the amount of revolution of a motor 111 for rotating the θ stage 104 is calculated on the basis of the position data of the alignment reference holes 115a and 115b. The output signal of the CPU 134 is converted to an analog signal by a digital-analog converter 135 and is supplied to the motor 111 through a servo amplifier 136 and a power amplifier 137, whereby the motor 111 is driven. The number of revolutions of the motor 111 is detected by a rotary encoder 112, and is converted to a voltage signal corresponding to the number of revolutions by an F/V converter 139 and fed back as a speed control signal and also, the positional information is detected by a counter 140 and fed back as the stop position control signal of the motor 111 to the CPU 134.

Figure 14:
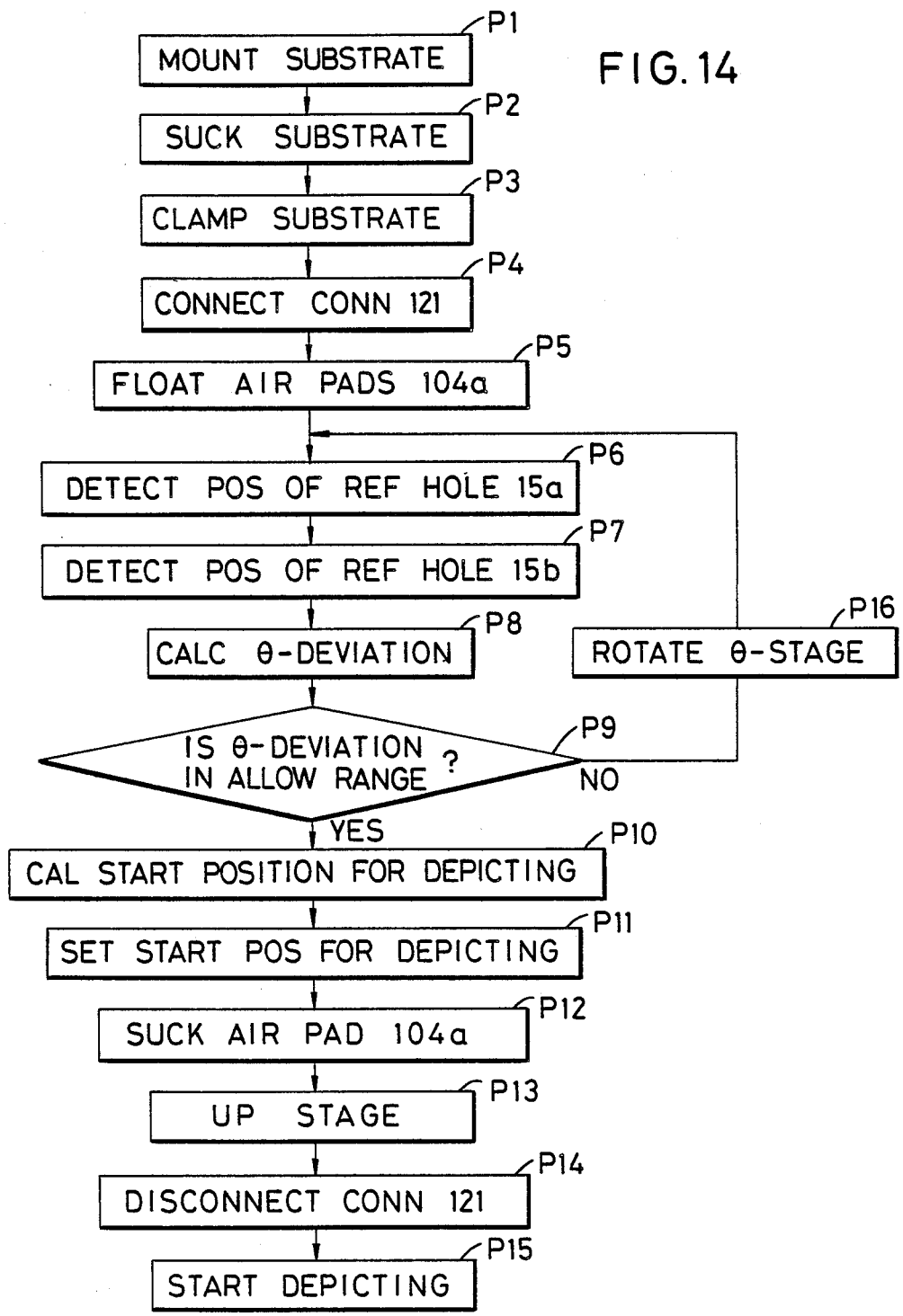

This embodiment will hereinafter be described with reference to the operation sequence of FIG. 14.

Figure 15A:
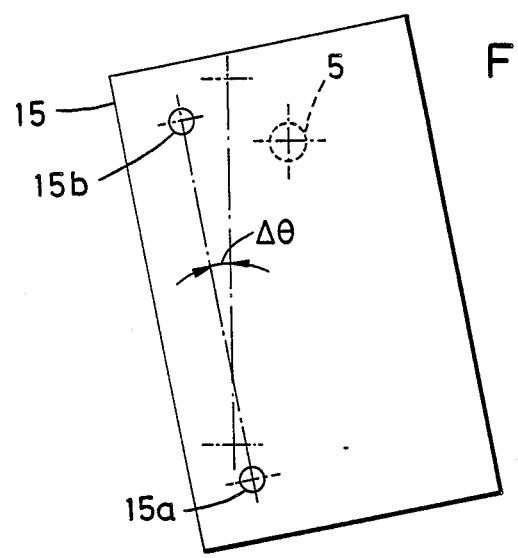
FIGS. 15a and 15b illustrate the aligned state of a substrate to be printed.
Figure 15B:
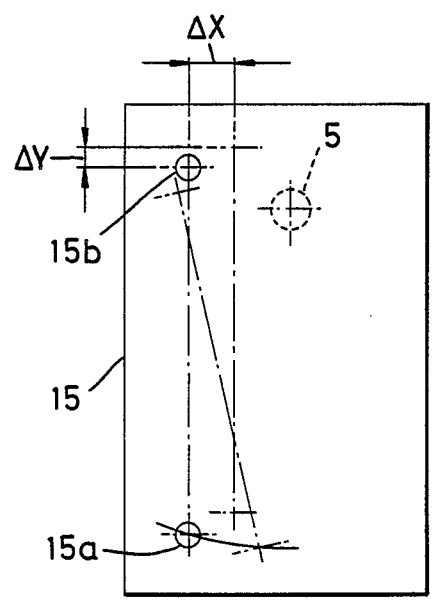

The substrate 115 to be printed mounted on the sample table 113 at procedure P1 is vacuumsucked through the vent hole 113a at procedure P2 by operating the direction control valve 122A1 of the air pressure logic circuit 122 by the air pressure cylinder 123. At procedure P3, the direction control valve 122A3 is likewise operated and the substrate 115 to be printed is held between the clamp member 116 and the sample table 113. This is for the purpose of minimizing the measurement errors of the positions of the alignment reference holes 115a and 115b resulting from the warp of the substrate 115 to be printed. Subsequently, at procedure P4, the automatic detachable connector 121 is connected so that the electronic parts on the moving stage 103 can operate, and at procedure P5, the direction control valve 122A7 is operated by the air pressure cylinder 123, and air is injected from the air pads 104a of the θ stage 104 to cause the θ stage to float up slightly from the moving stage 103, thereby making it rotatable about the guide pin 105. Then, at procedures P6 and P7, the positions of the alignment reference holes 115a and 115b are read by the position sensor 118, and at procedure P8, the positional displacement Δθ in θ direction (see FIG. 15a) is calculated. When it is judged at procedure P9 that this positional displacement Δθ is outside the tolerance, the stage 104 is rotated by a predetermined amount by the motor 111 at procedure P16, and the operations of procedures P6–P8 are again performed. When the positional displacement Δθ is within the tolerance, the substrate 115 to be printed is brought into the state of FIG. 15b, thus completing the alignment of the substrate 115 to be printed in θ direction. Subsequently, by the use of the position data of the alignment reference holes 115a and 115b in this state, the positional displacements ΔX and ΔY in the X-axis direction and the Y-axis direction are calculated at procedure P10, whereby the depiction starting positions on the X-axis and Y-axis are calculated, and at procedure P11, the depiction starting position of the depicting apparatus is internally set. Then, at procedure P12, the direction control valve 122A8 is operated and the air pads 104a of the θ stage 104 are vacuum-sucked and fixed to the moving stage 103, and at procedure P13, the direction control valve 122A5 is operated and the air pressure cylinder 114 is extended, and the sample table 113 is moved up until the upper surface of the clamp member 116 bears against the reference level setting member 119. Finally, at procedure P14, the cylinder 121d is contracted and the automatic detachable connector 121 is disconnected, and at procedure P15, depicting is started. When depicting is effected, the connector 121 as well as the air pressure cylinders 123 is disconnected from the moving stage 103. Accordingly, in case of the moving stage 103 of the present embodiment, load applied thereto is smaller and there is no fluctuation of load which otherwise occurs during movement of the moving stage 103 and deteriorates linearity of the movement, in comparison with a case where the moving stage is moved while cord for transmitting electric signals and tube for transmitting air pressure signals are connected.

When depiction is to be effected on a substrate to be both-side-printed or a multilayer substrate to be printed by the depicting apparatus described above, it is necessary to form and process a pattern repetitively on the same substrate to be printed and at that time, it is necessary that the patterns on the front and back surfaces of the substrate to be both-side-printed or the positions of the patterns of individual printed wiring plates constituting the multilayer substrate to be printed be depicted with good accuracy. If an error occurs to this positional accuracy, there will occur displacement to the positions of the lands of the front and back surfaces of the substrate to be both-sideprinted which should originally coincide with each other, or to the lands of the printed wiring plates of the respective layers of the multilayer substrate to be printed, and the lands to be connected in the through-hole processing step thereafter cannot become connected, and the patterns disposed between these lands may be electrically short-circuited to each other or may cause unsatisfactory insulation from each other.

Heretofore, alignment adjustment has been accomplished with a positioning pin inserted in the alignment reference hole 115a, but the relation between the push-in force with which the positioning pin is fitted into the alignment reference hole 115a and the thickness of the substrate is delicate and, when the fit is loose, an alignment error occurs, and when the positioning pin is forced into the alignment reference hole 115a, the latter is enlarged or otherwise deformed, and particularly in the case of a substrate having a thickness of the order of 0.1 mm, accurate alignment cannot be accomplished and further, the alignment reference hole is damaged, and this has led to the problem that the positional accuracy between the patterns goes wrong.

According to the present embodiment, the position of the substrate to be printed is optically detected in a non-contact fashion and the displacement of the θ stage 104 in θ direction is corrected, and depiction is effected with the positional displacements in the X-axis and Y-axis directions being shifted in the depiction starting position and therefore, highly accurate alignment can be accomplished by a simple mechanism.

Also, paying attention to the fact that the individual operations on the moving stage such as (the vacuum-sucking of the substrate to be printed) may be effected when the moving stage is being stopped at its initial position, the apparatus is equipped with an air pressure logic circuit and an automatic detachable connector, whereby highly accurate operation of the moving stage is ensured without drawing a number of wirings and pipings out of the moving stage.

Figure 16:
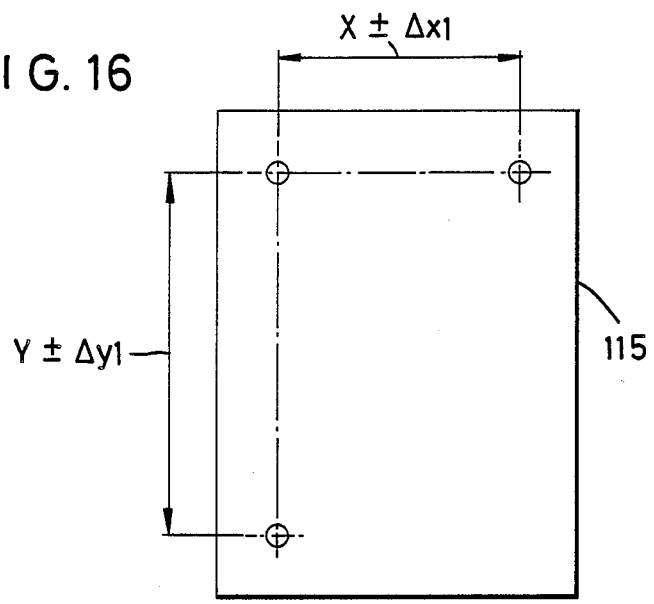

While two position sensors are carried in the above-described embodiment, position sensors may be carried at three corners on the moving stage and along with the alignment operation, the expansions and contractions $\pm \Delta x_1$ and $\pm \Delta y_1$ of the substrate to be printed in the X-axis and Y-axis directions as shown in FIG. 16 may be measured, and on the basis of this data, the scaling of the depicting art work can all be accomplished automatically, whereby power saving, throughput and yield can be improved.

Figure 17:
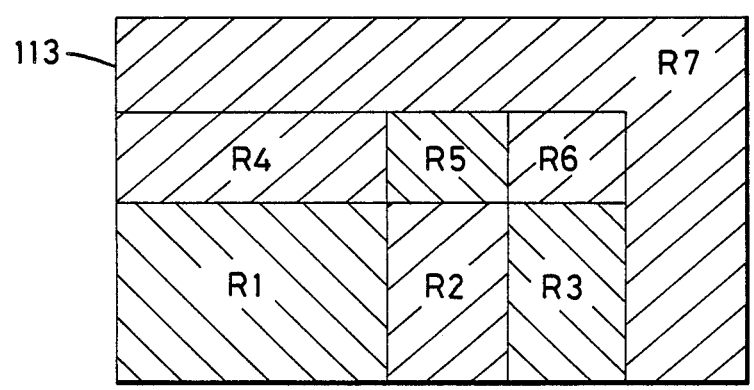
Figure 18A:
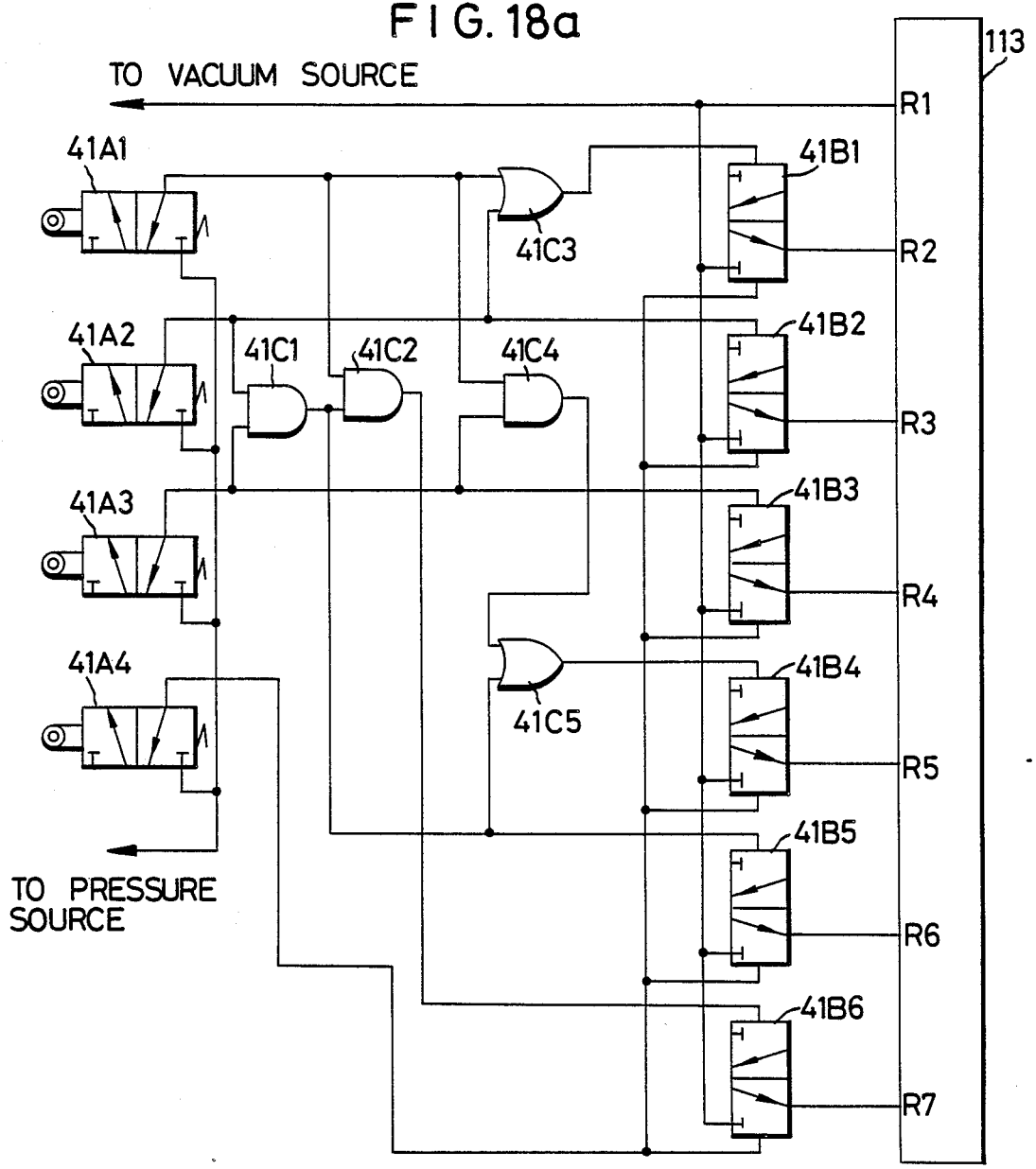
FIG. 18a is a circuit diagram of the air pressure circuit corresponding to FIG. 17.

Further, in the above-described embodiment, sucking is effected uniformly through all the vent holes 113a formed in the sample table 113, but alternatively, as shown in FIG. 17, seven sucking areas R1–R7 may be set on the sample table 113 and these sucking areas may be selected in accordance with the size of the substrate to be printed. In this case, as shown in FIG. 18a, mechanically operated type direction control valves 141A1–141A4 and change-over valves 141B1–141B6 similar to those described above are connected by fluid elements 141C1–141C5 and the change-over valves 141B1–141B6 are appropriately connected to the respective sucking areas R1–R7 of the sample table. Thereby, as shown in FIG. 18b, the operation of the sucking areas R1–R7 (indicated by "1") is obtained for the operation of the direction control valves 141A1–141A4 (indicated by "1"), and by appropriately selecting the sucking areas in accordance with the size of the substrate to be printed, substrates of various sizes to be printed can be successively depicted fully automatically.

According to the present embodiment, a rotatable stage mechanism is provided in the gap formed between the moving stage and the sample table by a sample table lifting mechanism installed on the moving stage and therefore, a moving stage device of low full height can be provided.

What we claim is:

1. An apparatus for loading a planar subject to be worked at a predetermined level, including:
   (a) holding means operative to hold one end portion of the surface of said subject to be worked at a first level; and
   (b) regulating means for detecting the thickness of said subject to be worked from the amount of operation of said holding means and regulating the other end portion of the surface of said subject to be worked to a second level on the basis of a result of said detection.

2. An apparatus according to claim 1, further including pattern depicting means for scanning the surface of said subject to be worked by a modulated energy beam and producing a pattern on said surface.

3. An apparatus according to claim 2, wherein said holding means includes a contacting portion for holding said one end portion at said first level when said one end portion bears against said contacting portion, and an actuator for driving said one end portion to urge said one end portion against said contacting portion, and said regulating means includes a displacing portion displaceable by an amount corresponding to the amount of operation of said actuator to regulate said other end portion to said second level.

4. An apparatus according to claim 3, wherein said holding means includes a supporting table on which said subject to be worked is supported, and said actuator holds said subject to be worked between said supporting table and said contacting portion.

5. An apparatus according to claim 4, wherein said contacting portion is movable in the direction of operation of said actuator, said holding means includes a limiting portion contacted by said contacting portion to limit the amount of operation of said contacting portion, and said actuator includes a first actuator and a second actuator, said first actuator being disposed between said contacting portion and said supporting table and driving said subject to be worked so as to be held between said contacting portion and said supporting table, said second actuator being disposed between said limiting portion and said supporting table and driving said supporting table until said contacting portion bears against said limiting portion.

6. An apparatus according to claim 4, wherein said regulating means further includes a regulating portion disposed between the portion of said supporting table on which said one end portion is placed and said displacing portion, said regulating portion being displaceable in conformity with the amount of displacement of said displacing portion to thereby regulate the level of the portion of said supporting table on which said one end portion is placed so that the level of said one end portion of said subject to be worked is said second level.

7. An apparatus according to claim 3, further including a moving stage reciprocally movable in one direction in synchronism with the scanning of said energy beam and wherein said holding means and said regulating means are disposed on said moving stage.

8. An apparatus according to claim 5, further including a moving stage reciprocally movable in one direction in synchronism with the scanning of said energy beam and wherein said holding means and said regulating means are disposed on said moving stage, and said limiting portion is fixedly mounted on said moving stage.

9. An apparatus according to claim 4, wherein said supporting table includes means for suching said subject to be worked.

10. An apparatus for loading a subject to be worked, including:
(a) a moving stage movable in at least one direction;
(b) a supporting table having a supporting surface on which said subject to be worked is placed and installed on said moving stage;
(c) a lifting actuator disposed between said moving stage and said supporting table and moving said supporting table up and down in a direction orthogonal to said supporting surface relative to said moving stage to thereby hold said supporting table at a predetermined level; and
(d) a rotating actuator disposed between said moving stage and said supporting table to rotate said supporting table in said supporting surface;
(e) said lifting actuator and said rotating actuator being arranged side by side on said moving stage, said lifting actuator being rotatable in said direction of rotation relative to said supporting table, said rotating actuator being movable in said direction of upward and downward movement relative to said supporting table.

11. An apparatus for loading a subject to be worked, including:
(a) a stage;
(b) stage driving means for driving said stage in at least one direction;
(c) a supporting table having a supporting surface on which said subject to be worked is placed and installed on said stage;
(d) supporting table driving means disposed between said stage and said supporting table to displace said supporting table relative to said stage;
(e) control means producing a stage control signal for controlling said stage driving means and a supporting table control signal for controlling said supporting table driving means, and
(f) connecting means including a movable connecting portion drive-controlled by said control means and connecting said control means and said supporting table driving means together to supply the supporting table control signal from said control means to said supporting table driving means;
(g) said control means operating said stage driving means by said stage control signal to displace said stage to a predetermined position, and then driving said movable connecting portion, whereby said movable connecting portion is displaced between a connecting position which achieves said connection and a disconnecting position which cuts off said connection.

12. An apparatus for loading a subject to be worked, including:
(a) a stage;
(b) stage driving means for driving said stage in at least one direction;
(c) a supporting table having a supporting surface on which said subject to be worked is placed, and installed on said stage;
(d) supporting table driving means disposed between said stage and said supporting table to displace said supporting table relative to said stage;
(e) driving energy supply means generating energy for driving said supporting table driving means;
(f) connecting means including a movable connecting portion for connecting said driving energy supply means and said supporting table driving means together to supply the energy from said driving energy supply means to said supporting table driving means; and
(g) control means for displacing said stage to a predetermined position by said stage driving means, and then driving said movable connecting portion, whereby said movable connecting portion is displaced between a connecting position which achieves said connection and a disconnecting position which cuts off said connection.

13. An apparatus for loading a subject to be worked, including:
(a) holding means operative to hold one end portion of a surface of said subject to be worked at a predetermined level; and
(b) regulating means for detecting the thickness of said subject to be worked from the amount of operation of said holding means and regulating the other end portion of the surface of said subject to be worked to a level dependent upon result of said detecting.

* * * * *